(12) United States Patent
Briggs et al.

(10) Patent No.: US 9,881,833 B1
(45) Date of Patent: Jan. 30, 2018

(54) BARRIER PLANARIZATION FOR INTERCONNECT METALLIZATION

(71) Applicant: INTERNATIONAL BUSINESS MACHINES CORPORATION, Armonk, NY (US)

(72) Inventors: Benjamin D. Briggs, Waterford, NY (US); Elbert E. Huang, Carmel, NY (US); Takeshi Nogami, Schenectady, NY (US); Raghuveer R. Patlolla, Guilderland, NY (US); Cornelius B. Peethala, Albany, NY (US); David L. Rath, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/334,796

(22) Filed: Oct. 26, 2016

(51) Int. Cl.
| | | |
|---|---|---|
| *H01L 29/40* | (2006.01) | |
| *H01L 21/768* | (2006.01) | |
| *H01L 23/522* | (2006.01) | |
| *H01L 23/532* | (2006.01) | |

(52) U.S. Cl.
CPC .... *H01L 21/7684* (2013.01); *H01L 21/76843* (2013.01); *H01L 21/76873* (2013.01); *H01L 21/76879* (2013.01); *H01L 23/5226* (2013.01); *H01L 23/53238* (2013.01)

(58) Field of Classification Search
CPC .................................................. H01L 21/3212
See application file for complete search history.

(56) References Cited

U.S. PATENT DOCUMENTS

| | | | |
|---|---|---|---|
| 5,486,234 A * | 1/1996 | Contolini | .......... H01L 21/32134 216/106 |
| 6,184,141 B1 * | 2/2001 | Avanzino | ............ H01L 21/3212 257/E21.304 |
| 6,211,087 B1 | 4/2001 | Gabriel et al. | |
| 6,376,361 B1 | 4/2002 | Chooi et al. | |
| 8,043,958 B1 | 10/2011 | Reid et al. | |
| 8,372,757 B2 | 2/2013 | Mayer et al. | |
| 9,123,785 B1 | 9/2015 | Duong et al. | |
| 9,224,639 B2 | 12/2015 | Duong et al. | |
| 9,343,408 B2 | 5/2016 | Duong et al. | |
| 2006/0040513 A1 * | 2/2006 | Callegari | .......... H01L 21/02126 438/795 |

(Continued)

FOREIGN PATENT DOCUMENTS

| | | |
|---|---|---|
| CN | 103474395 A | 12/2013 |
| CN | 103985670 A | 8/2014 |
| TW | I501302 B | 9/2015 |

*Primary Examiner* — Cuong Q Nguyen
*Assistant Examiner* — Nishath Yasmeen
(74) *Attorney, Agent, or Firm* — Tutunjian & Bitetto, P.C.; Vazken Alexanian

(57) ABSTRACT

A method for forming interconnect structures includes forming a barrier material over a dielectric layer having a trench, the barrier layer being disposed on sidewalls and horizontal surfaces of the trench, depositing an interconnect layer over the barrier layer to form an interconnect structure, recessing the interconnect layer down to a surface of the barrier layer using a chemical mechanical planarization process, and planarizing the barrier layer and the interconnect layer using a wet etch process to form a coplanar surface to prevent dishing or divots in the interconnect structure.

16 Claims, 5 Drawing Sheets

(56) References Cited

U.S. PATENT DOCUMENTS

| | | | |
|---|---|---|---|
| 2008/0102631 A1* | 5/2008 | Andryushchenko | ........................ H01L 21/32115 438/686 |
| 2013/0224959 A1 | 8/2013 | Cotte et al. | |
| 2013/0320520 A1* | 12/2013 | Michalak | ............ H01L 21/3105 257/734 |
| 2014/0264647 A1* | 9/2014 | Katragadda | ......... B81C 1/00238 257/415 |
| 2016/0079173 A1* | 3/2016 | Tung | ................ H01L 23/53238 257/751 |

* cited by examiner

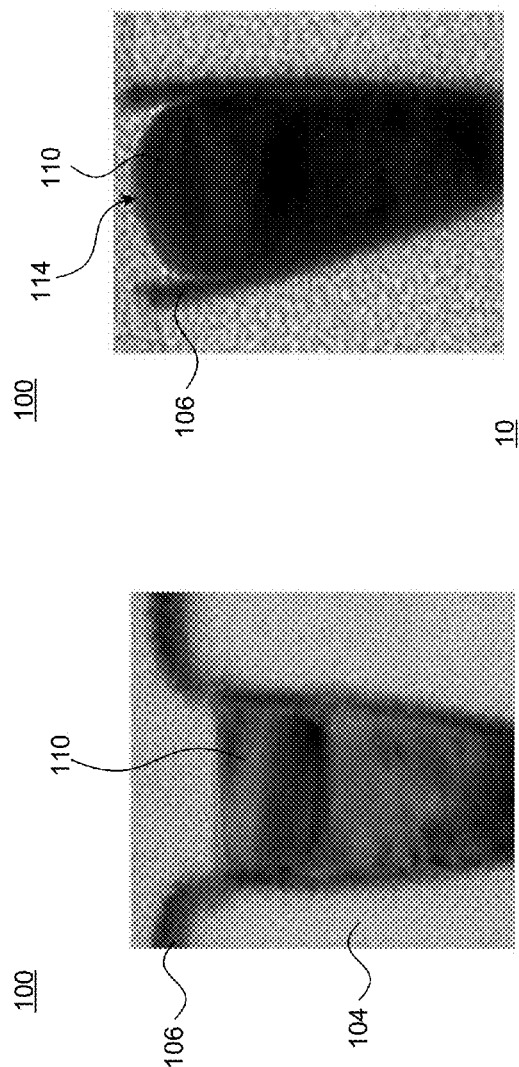
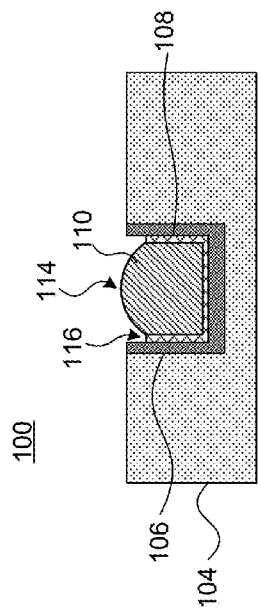
FIG. 4A (Prior Art)
FIG. 4B (Prior Art)
FIG. 4C (Prior Art)

BARRIER PLANARIZATION FOR INTERCONNECT METALLIZATION

BACKGROUND

Technical Field

The present invention relates to semiconductor processing, and more particularly to a barrier structure and methods for barrier planarization to reduce damage to interconnect structures.

Description of the Related Art

Reliability and electromigration (EM) performance are negatively impacted as barrier thickness is downscaled in back end of the line (BEOL) interconnects. In addition to risks associated with barrier continuity on sidewalls, discontinuities in interconnect structures negatively impact device performance. For example, current metallization schemes employ chemical mechanical polishing/planarization (CMP) to remove excess portions of barrier layers. CMP is an abrasive process of smoothing surfaces with the combination of chemical and mechanical forces. However, such CMP processes form divots and/or dishing in the interconnect structures which negatively impact line resistance and cap coverage, and results in EM degradation.

SUMMARY

In accordance with an embodiment of the present invention, a method for forming interconnect structures includes forming a barrier material over a dielectric layer having a trench, the barrier layer being disposed on sidewalls and horizontal surfaces of the trench, depositing an interconnect layer over the barrier layer to form an interconnect structure, recessing the interconnect layer down to a surface of the barrier layer using a chemical mechanical planarization process, and planarizing the barrier layer and the interconnect layer using a wet etch process to form a coplanar surface to prevent dishing or divots in the interconnect structure.

In accordance with an embodiment of the present invention, another method for forming interconnect structures includes forming a barrier material over a dielectric layer having a trench, the barrier layer being disposed on sidewalls and horizontal surfaces of the trench, depositing seed layer over the barrier layer, electroplating an interconnect layer over the seed layer to form an interconnect structure, recessing the interconnect layer and the seed layer down to a surface of the barrier layer using a chemical mechanical planarization process, and planarizing the barrier layer, the seed layer and the interconnect layer using a wet etch process to form a coplanar surface to prevent dishing or divots in the interconnect structure.

In accordance with an embodiment of the present invention, a semiconductor device includes a dielectric layer having at least one trench formed therein, a barrier material formed on the dielectric layer, the barrier layer being disposed on sidewalls and horizontal surfaces of the at least one trench, and an interconnect layer disposed in the at least one trench to form an interconnect structure, wherein the interconnect layer and the barrier material form a coplanar surface to prevent dishing or divots in the interconnect structure.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 4A is a SEM image of an interconnect structure to demonstrate damage incurred by a conventional CMP process;

FIG. 4B is a SEM image of an interconnect structure to demonstrate damage incurred by a conventional CMP process;

FIG. 4C is a cross-sectional view showing a partially fabricated semiconductor device to demonstrate damage incurred by a conventional CMP process.

DETAILED DESCRIPTION

Figure 1A:
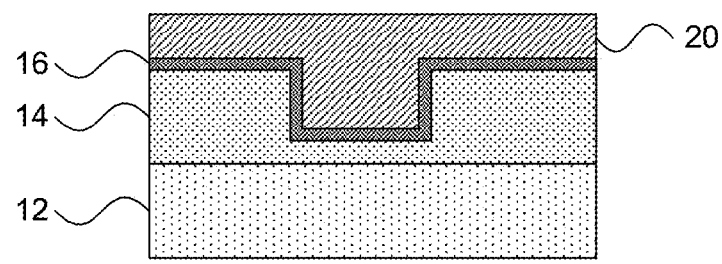
FIG. 1A is a cross-sectional view showing a partially fabricated semiconductor device in accordance with an embodiment of the present invention.

Semiconductor devices and methods for fabrication of such devices are provided that include a combination of chemical mechanism planarization (CMP) and wet etch processes to process barrier layers. The CMP and wet etch processes result in interconnect structures having a planar surface. The resulting interconnect structure enables highly reliable metallization and improved electromigration (EM) performance. To meet reliability targets, the combination of chemical mechanism planarization (CMP) and wet etch processes prevent interconnects having divots and/or dishing structures, thereby preventing EM degradation.

In some embodiments, the metallizations may include Copper (Cu) although other highly conductive materials and in particular metals may be employed. In some embodiments, a barrier layer is disposed between a substrate and the metallization (e.g., Cu interconnect) and can include, e.g., Tantalum Nitride (TaN), or similarly functioning material. Some embodiments may include a liner disposed between the metallizations and the barrier layer(s). The liner may include, e.g., Cobalt (Co), Ruthenium (Ru), or similar functioning materials. Other materials may also be employed for the barrier layer, liner and/or the interconnect metallization.

The following description may be employed in any semiconductor device or integrated circuit. The ion barriers as described herein may be formed between any two conductors to prevent electromigration due to ion flow. The present invention may also be employed in vertical as well and horizontal interconnects, and may be employed in contacts at tops of vias as well as or in addition to the bottoms of vias.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., CuPt. These compounds include different proportions of the elements within the compound, e.g., CuPt includes $Cu_xPt_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1A, a partially fabricated semiconductor device 10 is depicted showing a substrate 12 and a dielectric layer 14, which are processed to form a via or trench. The trench may be formed, for example, by reactive ion etch (RIE) processes or other etches processes known in the art. The substrate 12 includes, for example, silicon (Si), silicon carbide (SiC), SiGe, GaAs, GaN, GaNP, Graphene, or any other known materials. The dielectric layer 14 includes an oxide layer, such as an ultralow dielectric-k (ULK) material. In some embodiments, the ULK type materials includes a mix of SiCOH with some porosity. The ULK type material can reduce capacitance compared to higher-k materials.

A barrier layer 16 is deposited over the trench such that the barrier layer 16 extends over horizontal surfaces and vertical surfaces of the dielectric layer 14. The barrier layer 16 can be sputtered, deposited by evaporation methods, deposited by chemical vapor deposition (CVD) methods or any other suitable deposition method. The barrier layer 16 includes Ta, TaN, TiN, combinations thereof, or other suitable materials. In some embodiments, the barrier layer 16 is a diffusion barrier to prevent Cu from diffusing into the ULK. Cu diffusion can lead to shorts and/or reliability concerns.

A metal deposition process is performed to form interconnect metallizations including, e.g., interconnect structure 20. In some embodiments, the interconnect 20 includes Cu, Co and/or similarly functioning materials. The interconnect 20 may be formed by, for example, electroplating Cu material in and above the trench. In some embodiments, a seed layer (not shown) including e.g., Co, ruthenium (Ru) or similarly functioning materials can be deposited as a seed layer prior to depositing the interconnect structure 20, as will be described in further detail below.

Figure 1B:
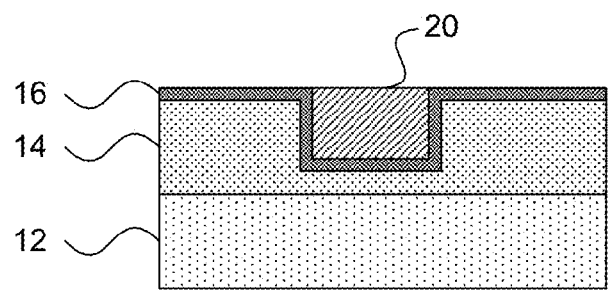
FIG. 1B is a cross-sectional view showing a partially fabricated semiconductor device in accordance with an embodiment of the present invention.

Referring to FIG. 1B, a first planarization process is performed to planarize the interconnect material 20. The first metal layer planarization process is described as being first in the relative sense. The first planarization process includes, for example, a chemical mechanical polishing (CMP) process. The interconnect material 20 is recessed down to a surface of the barrier layer 16 to remove the interconnect material 20 from areas outside the trench. In some embodiments, the CMP process is selective to the material used for interconnect structure 20 such that only the material of the interconnect structure 20 is removed. For example, the CMP process illustrated in FIG. 1B can be a Cu CMP process to selectively remove the interconnect 20 to a surface of the barrier layer 16.

Figure 1C:
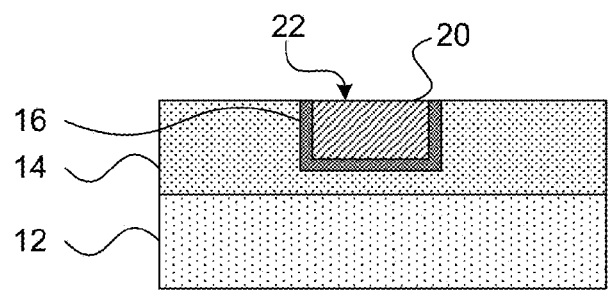
FIG. 1C is a cross-sectional view showing a partially fabricated semiconductor device in accordance with an embodiment of the present invention.

Now referring to FIG. 1C, a second planarization process is performed to planarize the interconnect material 20 and the barrier layer 16 to form a coplanar surface 22 free from divots and/or dishing. The dielectric layer 14 is re-exposed such that the dielectric layer 14, barrier layer 16, and interconnect 20 form a coplanar surface 22. The second planarization process includes, for example, a wet etch process (e.g., isotropic wet etching). Wet etching is a material removal process that uses liquid chemicals or etchants to remove materials. It should be noted that processes involving wet etching to remove other materials (e.g., Ti/TiN) do not work for TaN wet etch since TaN is a different material and removing it using wet etch is not known.

Accordingly, the wet etch planarization prevents divots and dishing of the interconnect material 20, thereby resulting in improved EM performance and reliability. The second planarization process may employ different wet etch selectivity rates depending on the materials used for the dielectric layer 14, barrier layer 16, and interconnect 20 such that the barrier layer 16 is removed selective to the dielectric layer 14 and interconnect 20. For example, TaN:Cu wet etch has a selectivity of 8:1, TaN:Co wet etch has a selectivity of 48:1 or higher, and TaN:ULK wet etch has a selectivity of 48:1 or higher. Etch selectivity is defined by the ratio of relevant etch rates between two materials. For example, TaN:Cu having 8:1 selectivity means the wet etch being described can etch 8 nm of TaN in the same amount of time as 1 nm of Cu is etched. Thus, the second planarization process has little to no impact to the dielectric layer 14, interconnect 20 and seed layer (not shown), if employed.

Subsequent planarization processes using wet etch techniques can be employed to further reduce the height of the coplanar surface 22. For example, a third planarization process (not shown) can be performed to planarize the dielectric layer 14, barrier layer 16, seed layer (not shown), and interconnect 20. Accordingly, various pitch structures of the dielectric layer 14, barrier layer 16, seed layer (not shown), and interconnect 20 can be achieved. Because the third planarization process employs wet etch techniques, the subsequent coplanar surface is free from divots and/or dishing.

Processing may continue with the formation of additional metal layers and contacts (along with ILD layers). The additional contacts may include ion flow barriers 24 formed in a same way or may include variations on the size and composition of the ion flow barrier 24 in accordance with the design of the device 10.

Figure 3A:
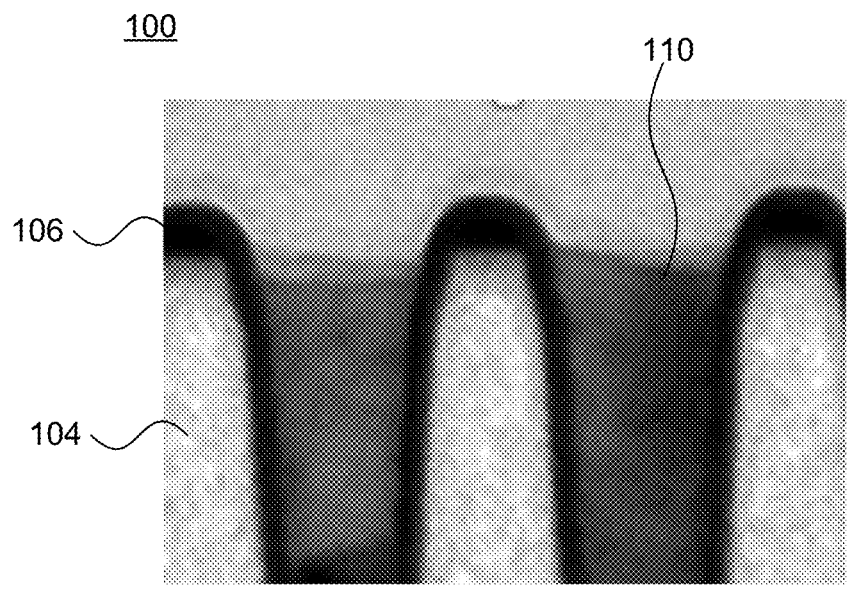
FIG. 3A is a scanning electron microscope (SEM) image of an interconnect structure to demonstrate damage incurred by a conventional chemical mechanical polishing/planarization (CMP) process.

Referring to FIG. 3A, another partially fabricated semiconductor device 10 is depicted showing a substrate 12 and a dielectric layer 14, which are processed to form a via or trench. The trench may be formed, for example, by reactive ion etch (RIE) processes or other etches processes. The substrate 12 includes, for example, silicon (Si), silicon carbide (SiC), or any other known materials. The dielectric layer 14 includes an oxide layer, such as an ultralow dielectric-k (ULK) material.

A barrier layer 16 is deposited over the trench such that the barrier layer 16 extends over horizontal surfaces and vertical surfaces of the dielectric layer 14. The barrier layer 16 can be sputtered, deposited by evaporation methods, deposited by chemical vapor deposition (CVD) methods or any other suitable deposition method. The barrier layer 16 includes Ta, TaN, TiN, combinations thereof, or other suitable materials.

A seed layer 18 can be deposited over the barrier layer 16. The seed layer 18 includes, for example, Co, Cu, CuMn or other suitable materials. In an embodiment, the seed layer 18 provides a layer of continuous, low resistance, electrical conductivity during the metal electroplating. The seed layer 18 may be sputtered, deposited by evaporation methods, deposited by chemical vapor deposition methods or any other suitable deposited method. For example, a physical vapor deposition (PVD) process may be employed to form the seed layer 18.

A metal deposition process is performed to form interconnect metallizations including, e.g., interconnect structure 20. In some embodiments, the interconnect 20 includes Cu, Co and/or similarly functioning materials. The interconnect 20 may be formed by, for example, electroplating Cu material over the seed layer 18.

Figure 2A:
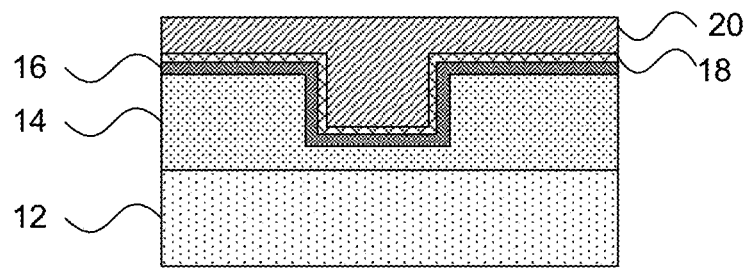
FIG. 2A is a cross-sectional view showing a partially fabricated semiconductor device in accordance with an embodiment of the present invention.
Figure 2B:
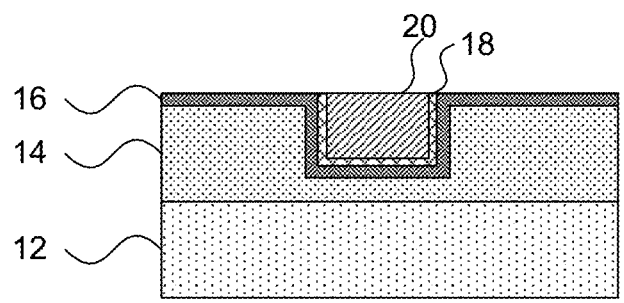
FIG. 2B is a cross-sectional view showing a partially fabricated semiconductor device in accordance with an embodiment of the present invention.

Referring to FIG. 2B, a first planarization process is performed to planarize the interconnect material 20 and the seed layer 18. The first planarization process includes, for example, a chemical mechanical polishing (CMP) process. The interconnect material 20 and seed layer 18 are recessed down to a surface of the barrier layer 16 to remove the interconnect material 20 and seed layer 18 from areas outside the trench. In some embodiments, the CMP process is selective to the material used for interconnect structure 20 and/or seed layer 18 such that only the material of the interconnect structure 20 and/or seed layer 18 is removed.

Figure 2C:
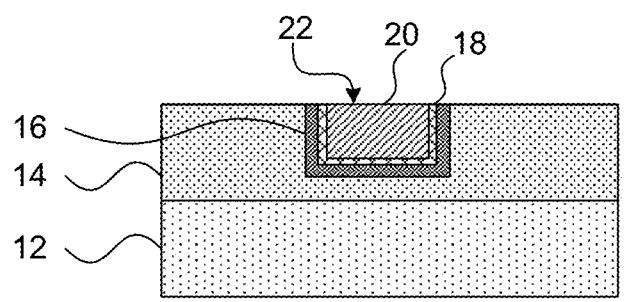
FIG. 2C is a cross-sectional view showing a partially fabricated semiconductor device in accordance with an embodiment of the present invention.

Now referring to FIG. 2C, a second planarization process is performed to planarize the interconnect material 20, seed layer 18 and the barrier layer 16 to form a coplanar surface 22 free from divots and/or dishing. The dielectric layer 14 is re-exposed such that the dielectric layer 14, barrier layer 16, seed layer 18 and interconnect 20 form a coplanar surface 22. The second planarization process includes, for example, a wet etch process. Accordingly, the wet etch planarization prevents divots and dishing of the interconnect material 20 and seed layer 18, thereby resulting in improved EM performance and reliability.

Subsequent planarization processes using wet etch techniques can be employed to further reduce the height of the coplanar surface 22. For example, a third planarization process (not shown) can be performed to planarize the dielectric layer 14, barrier layer 16, seed layer 18, and interconnect 20. Accordingly, various pitch structures of the dielectric layer 14, barrier layer 16, seed layer 18, and interconnect 20 can be achieved. Because the third planarization process employs wet etch techniques, the subsequent coplanar surface is free from divots and/or dishing.

Figure 3B:
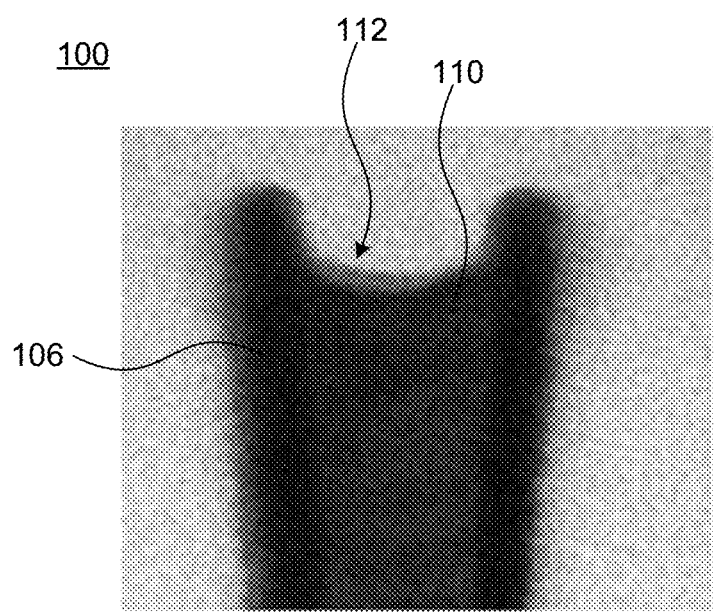
FIG. 3B is a SEM image of an interconnect structure to demonstrate damage incurred by a conventional CMP process.

Referring to FIGS. 3A-3B, a transmission electron microscope (TEM) image of a semiconductor device 100 to demonstrate defects incurred by a conventional CMP process is shown with a feature size on the order of 2-100 nm. The image demonstrates the effect of chemical mechanical polishing/planarization (CMP) to remove excess portions of barrier layers. As shown in FIG. 3A, a CMP process planarizes the interconnect material 110 down to a surface which is below the surface of a barrier layer 106. Excess portions of the barrier layer 106 remain on exposed surfaces of material layer 104 (e.g., a dielectric material).

In FIG. 3B, a subsequent planarization process, which includes CMP, planarizes the barrier layer 106 to remove the excess portions. However, because CMP is an abrasive process and the barrier layer 106 has a different etch rate than the interconnect material 110, such CMP processes form dishing in the interconnect structure 110, as shown by a concave surface 112 of interconnect 110, especially when the interconnect material 110 includes Cu. In addition, the interconnect 110 exhibits polishing scratches (not shown) on the surface 112 due to the CMP process. Accordingly, the surface 112 of the interconnect 110 is not coplanar with the barrier layer 106. Dishing of the interconnect structure 110 negatively impacts line resistance and cap coverage, and results in EM degradation of semiconductor device 100. For example, dishing results in Cu area loss of the interconnect, and resistance is directly proportional to the Cu area. In addition, severe dishing can cause the subsequent dielectric cap to be non-continuous allowing oxygen to penetrate into the interconnect and degrade EM reliability.

Now referring to FIGS. 4A-4C, a transmission electron microscope (TEM) image of a semiconductor device 100 to demonstrate damage incurred by a conventional CMP process is shown. The image demonstrates the effect of chemical mechanical polishing/planarization (CMP) to remove excess portions of barrier layers. As shown in FIG. 4A, a CMP process planarizes the interconnect material 110 down to a surface which is below the surface of a barrier layer 106. Excess portions of the barrier layer 106 remain on exposed surfaces of material layer 104.

In FIG. 4B, a subsequent planarization process, which includes CMP, planarizes the barrier layer 106 to remove the excess portions. However, because CMP is an abrasive process and the barrier layer 106 has a different etch rate than the interconnect material 110, such CMP processes form divots in the interconnect structure 110 and results in the interconnect structure 110 having a convex surface 114. In addition, the interconnect 110 exhibits polishing scratches (not shown) on the surface 114 due to the CMP process. Accordingly, the surface 114 of the interconnect 110 is not coplanar with the barrier layer 106. Divots in the interconnect structure 110 negatively impacts line resistance and cap coverage, and results in EM degradation of semiconductor device 100.

In FIG. 4C, a cross-sectional view showing a partially fabricated semiconductor device 100 is illustrated to demonstrate damage incurred by a conventional CMP process. The semiconductor device 100 demonstrates the effect of chemical mechanical polishing/planarization (CMP) to remove excess portions of barrier layers 106. In FIG. 4C, semiconductor device 100 includes a material layer 104, a barrier layer 106, a liner 108, and an interconnect 110. Due to conventional CMP processes, the interconnect 110 is shown having a convex surface 114 which is not coplanar with either the barrier layer and/or the material layer 104. In addition, the liner 108 is further reduced due to the CMP process. Accordingly, the interconnect structure 110 includes divots 116 which negatively impact line resistance and cap coverage, and results in EM degradation of semiconductor device 100. For example, divots create void spaces that are highly resistive. The liner material 108 that is lost/removed (e.g., divots 116) will create an easy path for Cu to migrate and therefore degrade EM performance.

In accordance with the present invention, a much more robust structure is provided. CMP processes have several potential defects including, for example, stress cracking, delaminating at weak interfaces, and corrosive attacks from chemicals. In addition, the abrasive process of CMP tends to form residual particles, which can become trapped within the interfaces, thereby creating short circuits and poor EM performance. Moreover, CMP processes can result in dishing and/or divoting within the interconnect structure, and thus form non-planar surfaces. In contrast, the wet etch process enables barrier planarization to provide coplanar interconnect structures, and the damage experienced with the interconnect structures is greatly diminished and even eliminated. The coplanar surface of the dielectric layer 14, barrier layer 16, seed layer 18 (if employed), and interconnect 20 provides sufficient line resistance and cap coverage. For example, dielectric caps typically have poor step coverage meaning that they do not grow well on vertical surfaces. If interconnect structures have insufficient topography (e.g., non-coplanar surfaces), it can result in discontinuous cap coverage.

Figure 5:
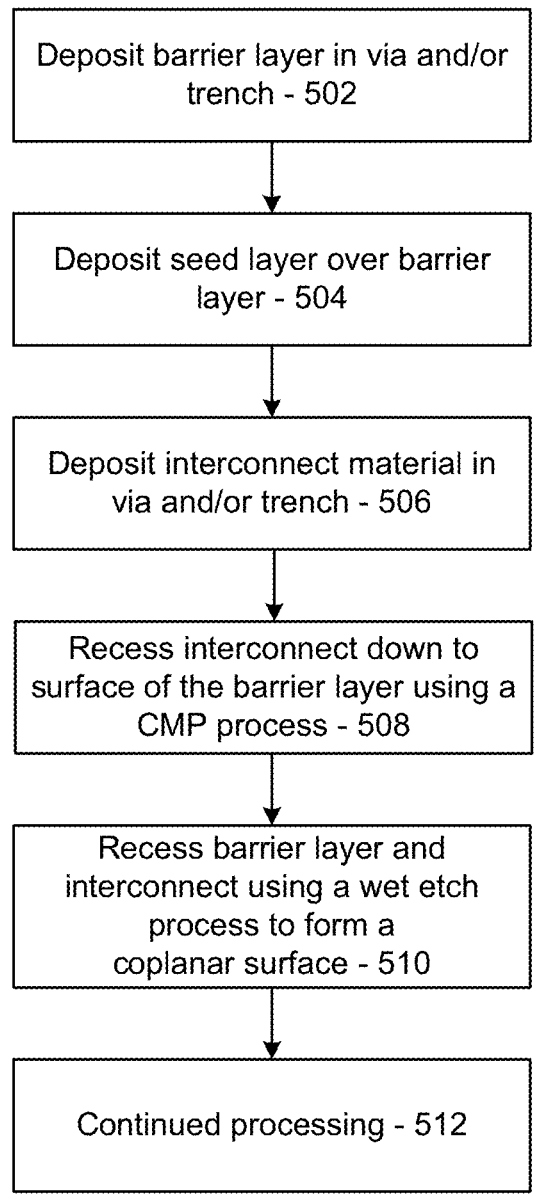
FIG. 5 is a block/flow diagram showing a system/method for barrier planarization in accordance with an embodiment of the present invention.

Referring to FIG. 5, a method for fabricating a semiconductor device is illustratively shown in accordance with one embodiment. In block 502, a barrier layer can be formed on sidewalls and/or the bottom of a via and/or trench through a dielectric layer and above the dielectric layer. For example, the barrier layer 16 can be sputtered, deposited by evaporation methods, deposited by chemical vapor deposition (CVD) methods or any other suitable deposition method and can extend over horizontal surfaces and vertical surfaces of the dielectric layer.

In block 504, a seed layer can be deposited over the barrier layer. The seed layer may be sputtered, deposited by evaporation methods, deposited by chemical vapor deposition methods or any other suitable deposited method, such as physical vapor deposition (PVD) process. The seed layer includes, for example, Co, Ru, or other suitable materials. In an embodiment, the seed layer 18 provides a layer of continuous, low resistance, electrical conductivity for the metal electroplating process.

In block 506, a metal deposition process is performed to form interconnect metallizations (e.g., an interconnect structure). In some embodiments, the interconnect includes Cu, Co and/or similarly functioning materials. The metal deposition process includes, for example, electroplating Cu material in and above the trench. In some embodiments, the metal deposition process includes depositing an interconnect structure over the seed layer.

In block 508, the interconnect structure and/or seed layer is recessed down to the barrier layer using a chemical mechanical planarization (CMP) process. As described above, the CMP process can be selective based on the materials employed for the interconnect and/or seed layer.

In block 510, the barrier layer, interconnect, and/or seed layer (if employed) is recessed using a wet etch process such that the barrier layer, interconnect, and seed layer (if employed) have a coplanar surface. In some embodiments, the dielectric layer is also recessed during the same wet etch process. The coplanar surface includes materials of the barrier layer, interconnect, and seed layer (if employed). In some embodiments, the coplanar surface includes materials of the dielectric layer, barrier layer, interconnect, and seed layer (if employed). As described above, the wet etch process enables barrier planarization to provide coplanar interconnect structures, and the damage experienced with the interconnect structures is greatly diminished. The coplanar surface of the dielectric layer, barrier layer, seed layer (if employed), and interconnect provides sufficient line resistance and cap coverage. In block 512, processing continues to complete the device.

Having described preferred embodiments for barrier planarization for interconnect metallization (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming interconnect structures, comprising:
    forming a barrier material over a dielectric layer having a trench, the barrier layer being disposed on sidewalls and horizontal surfaces of the trench;
    depositing an interconnect layer over the barrier layer to form an interconnect structure;
    recessing the interconnect layer down to a surface of the barrier layer using a chemical mechanical planarization process; and
    wet etching the barrier layer and the interconnect layer after the chemical mechanical planarization process to form a coplanar surface to prevent dishing or divots in the interconnect structure.

2. The method of claim 1, wherein the coplanar surface includes materials from the dielectric layer, the barrier material and the interconnect layer.

3. The method of claim 1, wherein the coplanar surface is free from defects.

4. The method as recited in claim 1, wherein the barrier material includes one or more of Ta, TaN, TiN or alloys thereof.

5. The method as recited in claim 1, further comprising forming a seed layer, the seed layer being disposed between the barrier material and the interconnect layer.

6. The method as recited in claim 5, wherein the seed layer includes one or more of Co, Ru or alloys thereof.

7. The method of claim 5, wherein the coplanar surface includes materials from the dielectric layer, the barrier material, the interconnect layer, and the seed layer.

8. The method of claim 1, wherein the wet etching includes selecting wet etch selectivity rates based on materials used for the dielectric layer, the barrier material, and the interconnect layer.

9. The method of claim 1, wherein the dielectric layer includes an ultralow dielectric-k (ULK) material.

10. The method of claim 5, wherein wet etching the barrier layer and the interconnect layer includes wet etching the seed layer to form the coplanar surface such that the coplanar surface includes materials from the dielectric layer, the barrier material, the interconnect layer, and the seed layer.

11. A method for forming interconnect structures, comprising:
    forming a barrier material over a dielectric layer having a trench, the barrier layer being disposed on sidewalls and horizontal surfaces of the trench;
    depositing seed layer over the barrier layer;
    electroplating an interconnect layer over the seed layer to form an interconnect structure;
    recessing the interconnect layer and the seed layer down to a surface of the barrier layer using a chemical mechanical planarization process; and
    wet etching the barrier layer, the seed layer and the interconnect layer after the chemical mechanical planarization process to form a coplanar surface to prevent dishing or divots in the interconnect structure.

12. The method of claim 11, wherein the coplanar surface includes materials from the dielectric layer, the barrier material, the seed layer, and the interconnect layer.

13. The method of claim 11, wherein the coplanar surface is free from defects.

14. The method as recited in claim 11, wherein the barrier material includes one or more of Ta, TaN, TiN or alloys thereof.

15. The method as recited in claim 11, wherein the seed layer includes one or more of Co, Ru or alloys thereof.

16. The method of claim 11, wherein the wet etching includes selecting wet etch selectivity rates based on materials used for the dielectric layer, the barrier material, the seed layer, and the interconnect layer.

* * * * *